(12) United States Patent
Shiraishi

(10) Patent No.: US 6,359,332 B2
(45) Date of Patent: Mar. 19, 2002

(54) PRINTED-WIRING SUBSTRATE HAVING LEAD PINS

(75) Inventor: Mitsuo Shiraishi, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 09/756,751

(22) Filed: Jan. 10, 2001

(30) Foreign Application Priority Data

Feb. 3, 2000 (JP) ........................................ 2000-025821

(51) Int. Cl.[7] .............................................. H01L 23/48
(52) U.S. Cl. ...................................................... 257/697
(58) Field of Search ........................................ 257/697

(56) References Cited

U.S. PATENT DOCUMENTS 5,249,100 A  * 9/1993 Satoh et al. ................. 361/689
6,300,678 B1 * 10/2001 Suehiro et al. .............. 257/697

FOREIGN PATENT DOCUMENTS

| JP | 58-192355 A | * 11/1983 | ........... H01L/23/12 |
| JP | 59-9951 | 1/1984 | |
| JP | 60-106375 | 7/1985 | |
| JP | 62-241361 A | * 10/1987 | ........... H01L/23/32 |
| JP | 1-181454 | 7/1989 | |
| JP | 3068224 | 5/2000 | |

* cited by examiner

*Primary Examiner*—Allan R. Wilson
(74) *Attorney, Agent, or Firm*—Sughrue Mion, PLLC

(57) ABSTRACT

A printed-wiring substrate including a substrate 101 having pin-bonding portions 111 formed on a main surface 104 thereof and lead pins 121. The lead pins 121 each have a flange 123 and a shaft portion 122 and being brazed to corresponding pin-bonding portions 111 via the corresponding flanges 123. A hemispherical convex shape is imparted to a bonding surface 124 of a flange 123. The flange 123 is used for brazing of a lead pin 121, and the bonding surface 124 faces a pin-bonding portion 111 of a substrate 101. A brazing filler metal 131 used for brazing of the lead pin 121 extends by wetting toward the tip end of the lead pin 121 beyond the outermost edge 127 of an opposite surface 126 of the flange 123, which is opposite the bonding surface 124 of the flange 123, such that an extension-by-wetting end of the brazing filler metal 131 is located between the outermost edge 127 and a shaft portion 122 of the lead pin 121. Since the solder 131 has no narrow portion, the bonding strength is not impaired.

7 Claims, 6 Drawing Sheets

PRINTED-WIRING SUBSTRATE HAVING LEAD PINS

BACKGROUND OF THE INVENTION

1. Field of the Invention

The present invention relates to a printed-wiring substrate having lead pins. More particularly, the invention relates to a printed-wiring substrate which is formed primarily from an insulating material, such as resin or ceramic, and has a number of pin-bonding portions (electrodes) formed on a main surface thereof. Lead pins (input/output terminals) are brazed to the corresponding pin-bonding portions; for example, to a printed-wiring substrate of a PGA (pin grid array) type (IC package), on which an electronic component, such as a semiconductor integrated circuit device (IC), is mounted in a sealed condition.

2. Description of the Related Art

A PGA type printed-wiring substrate (hereinafter, also referred to as a substrate) has a number of bonding portions (electrodes), each of which assumes the form of a pad, formed on one main surface for bonding to an IC, as well as a number of lead pins (hereinafter, also referred to as pins) provided on the other main surface for insertion into a socket provided on a motherboard. Each lead pin assumes the form of, for example, a nail and is brazed to a substrate such that a flange (a portion of the pin having a diameter greater than that of a shaft portion of the pin) located at an end portion of the pin abuts a pin-bonding portion of the substrate.

The above-mentioned pin-bonding structure is disclosed in Japanese Utility Model Application Laid-Open (kokai) No. 60-106375. Specifically, a convex portion is formed on the bonding surface of the flange located at an end portion (head portion) of the nail-shaped pin. The bonding surface of the flange faces a pin-bonding portion of the substrate. The pin is brazed to the substrate such that the convex portion abuts the pin-bonding portion. In the case of brazing a pin having a flange whose end portion serving as a bonding surface is flat, the amount of brazing filler metal present between the flange and a pin-bonding portion is small, resulting in small bonded area. By contrast, a convex portion allows for a larger amount therebetween. Since the large amount of brazing filler metal effects a stress-absorbing action, the bonding strength of the pin is increased.

A printed-wiring substrate formed from resin employs solder, which has a relatively low melting point as compared with brazing filler metal, for bonding a pin. As a result, the bonding strength of the pin tends to become insufficient. According to conventional practice, in order to cope with the problem involved in a printed-wiring substrate formed from resin, a lead pin serving as an input/output terminal has a flange formed at an intermediate position of a shaft portion thereof, and a hole is formed at a pin-bonding portion of the substrate. The lead pin is soldered to the substrate such that an end of the shaft portion thereof is inserted into the hole. However, preparation of the hole decreases space for wiring within the substrate, thereby decreasing the degree of freedom in design. Meanwhile, even in the case of a printed-wiring substrate formed from resin, it is conceivable that the bonding strength of even a nail-shaped pin can be increased considerably by using solder in a sufficient volume and by employing the bonding structure disclosed in the above-mentioned publication. In this case, soldering practice shown in FIG. 6 is considered appropriate. Specifically, a pin 121 is brazed to a pin-bonding portion 111 of a substrate 101 such that a brazing filler metal 131 covers the entirety of a flange 123 as in the case of internal chill (i.e., enveloped casting).

3. Problems Solved by the Invention

However, the above-mentioned practice raises the following problem. When the brazing filler metal 131 is applied so as to cover the entirety of the flange 123, the molten brazing filler metal extends (creeps) by wetting from the root of a shaft portion 122 of the pin 121 toward a tip end of the pin 121 (downward in FIG. 6). This means that the brazing filler metal 131 adheres to at least the root of the shaft portion 122. This impairs appearance and hinders insertion of the pin 121 into a socket of a motherboard after assembly into a semiconductor device, thereby impairing reliability of electrical connection.

As shown in FIG. 7, by employing a bonding structure for the pin 121 which reduces the amount of the brazing filler metal 131 to be consumed for bonding, extension by wetting of the brazing filler metal 131 to the shaft portion 122 of the pin 121 can be prevented. However, a narrow portion K, in the form of a meniscus, of the brazing filler metal 131 is formed. As a result, when an external force is applied to the pin 121, stress concentration tends to occur, thereby impairing the bonding strength of the pin 121 and the reliability of electrical connection. That is, when pin bonding is performed so as not to allow extension by wetting of a brazing filler metal of low melting point to the shaft portion as in the case of brazing with respect to a printed-wiring substrate formed from resin, a failure to obtain a desired bonding strength is highly likely; therefore, strict inspection of pin-bonding strength or quality control must be conducted.

SUMMARY OF THE INVENTION

In view of the above-mentioned problem involved in a printed-wiring substrate having lead pins, such as a PGA type printed-wiring substrate, an object of the present invention is to provide a printed-wiring substrate having lead pins brazed to corresponding pin-bonding portions of a substrate in which solder does not adhere to a shaft portion of the lead pin or impair pin-bonding strength, to thereby provide a highly reliable electrical connection.

The above object of the invention is achieved by providing a printed-wiring substrate comprising a substrate having pin-bonding portions formed on a main surface thereof and lead pins, the lead pins each having a flange and a shaft portion and being brazed to corresponding pin-bonding portions via the corresponding flanges, the flange having a convex portion formed on a bonding surface thereof in opposition to the pin-bonding portion, the printed-wiring substrate characterized in that:

a brazing filler metal brazing the lead pin to the pin-bonding portion extends by wetting toward the tip end of the lead pin beyond the outermost edge of a surface of the flange opposite the bonding surface such that the end of an extension of the brazing filler metal formed by wetting is located between the outermost edge and the shaft portion.

In the printed-wiring substrate having lead pins of the present invention, the brazing filler metal which extends by wetting does not reach the shaft portion and thereby does not hinder insertion of the lead pins into a socket. The brazing filler metal extends by wetting toward the tip end of the lead pin beyond the outermost edge of the surface of the flange opposite the bonding surface of the same. Such extension of applied solder means that the amount of applied solder is appropriate so as not to cause insufficient bonding strength.

When a molten brazing filler metal fails to extend beyond the outermost edge of the opposite surface, a narrow portion, in the form of a meniscus, of the brazing filler metal is formed as shown in FIG. 7, or the contour of a section of the brazing filler metal as sectioned by a plane including the axis of the shaft portion of the lead pin assumes the form of a concave arc (hereinafter, the term "narrow portion" includes the form of a concave arc). As a result, when an external force is applied to the lead pin, a brazed (bonded) portion tends to break due to stress concentration. By contrast, when the brazing filler metal extends beyond the outermost edge of the opposite surface as in the case of the present invention, the applied brazing filler metal is free of a narrow portion, because of sufficiency in the amount of applied brazing filler metal, thereby avoiding a substantial impairment in brazing strength. Thus, the present invention can provide a printed-wiring substrate having lead pins which does not raise a problem during insertion of the lead pins into a socket and is free of impairment in brazing strength and which provides a highly reliable electrical connection.

As mentioned above, according to the present invention, no problem arises during insertion of lead pins into a socket, and brazing strength is not impaired. Furthermore, since the lead pins are usually plated with gold, visual inspection can determine whether or not the extension-by-wetting end of molten brazing filler metal is located at the above-mentioned position. That is, the printed-wiring substrate of the present invention significantly facilitates inspection for assurance of quality, or quality control. Herein, the term "brazing filler metal" includes solder, and the term "solder" refers to a brazing filler metal having a melting point not higher than 450 degrees.

In a preferred embodiment, the entire bonding surface of the flange assumes a hemispherical form so as to serve as the convex portion. The shape of the convex portion is not particularly limited, so long as a sufficient amount of brazing filler metal is present between a pin-bonding portion of the substrate and the flange of a lead pin. Accordingly, the shape of the convex portion is preferably such that the entire bonding surface tapers off, such as conical or pyramidal. Particularly preferably, the entire bonding surface assumes a hemispherical form, for convenience of manufacture of lead pins.

The entire bonding surface does not necessarily serve as the convex portion. A portion of the bonding surface may serve as the convex portion. In this case, the convex portion does not necessarily taper off, but may assume the form of a circular cylinder or a prism. When a portion of the bonding surface serves as the convex portion, the convex portion is preferably located at the center of a bonding-surface side of the flange.

In the present invention, preferably, the diameter of a brazing surface of the pin-bonding portion is greater than the diameter of the flange. The diameter of a brazing surface of the pin-bonding portion refers to the diameter of the pin-bonding portion when a peripheral region of the pin-bonding portion is not covered with solder resist, or the diameter of an opening portion of solder resist when a peripheral region of the pin-bonding portion is covered with solder resist. In the present invention, preferably, the contour of a section of the brazing filler metal as sectioned by a plane including the axis of the shaft portion of the lead pin is substantially linear, and an angle θ between the contour and the main surface of the printed-wiring substrate falls within the range of 55 to 80 degrees.

The present invention is suitably applied to a printed-wiring substrate made of resin. A PGA type printed-wiring substrate is mentioned above as a typical example of the present invention. However, the present invention is not limited thereto. The printed-wiring substrate of the present invention encompasses a substrate having lead pins brazed to corresponding pin-bonding portions thereof, such as an interposer, which is bonded to a printed-wiring substrate (IC package) so as to connect the printed-wiring substrate to a motherboard.

DESCRIPTION OF REFERENCE NUMERALS

Figure 1:
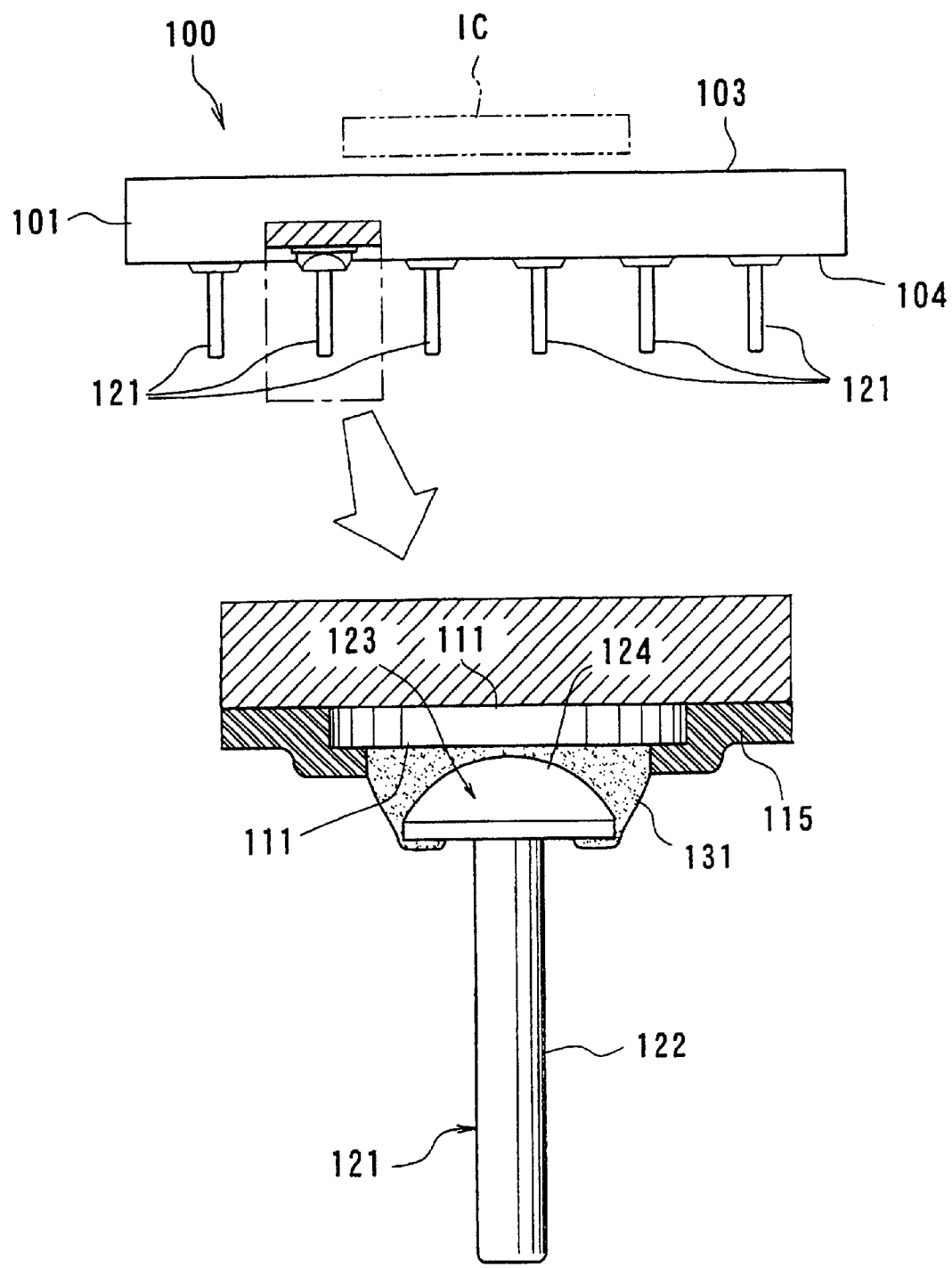
FIG. 1 is a side view showing a printed-wiring substrate having lead pins according to a first embodiment of the present invention with a partial cross section and enlarged view showing a main portion thereof (pin-bonding structure).

100: printed-wiring substrate having lead pins
101: substrate
103, 104: main surfaces of the substrate
111: pin-bonding portion
115: solder resist layer
121: lead pin
122: shaft portion of the lead pin
123: flange of the lead pin
124: bonding surface (convex portion) of the flange
126: opposite surface of the flange
127: outermost edge of the opposite surface of the flange
131: brazing filler metal (solder)
131*a*: end of an extension by wetting of the brazing filler metal toward the tip end of the lead pin
D2: diameter of the brazing surface of the pin-bonding portion
D3: diameter of the flange
G: axis of the shaft portion of the lead pin
S: contour of a section of the brazing filler metal
θ: angle between the main surface of the printed-wiring substrate and the contour S

DETAILED DESCRIPTION OF THE PREFERRED EMBODIMENTS

The invention will now be described by reference to the drawings, however, the invention should not be construed as being limited thereto.

Figure 2:
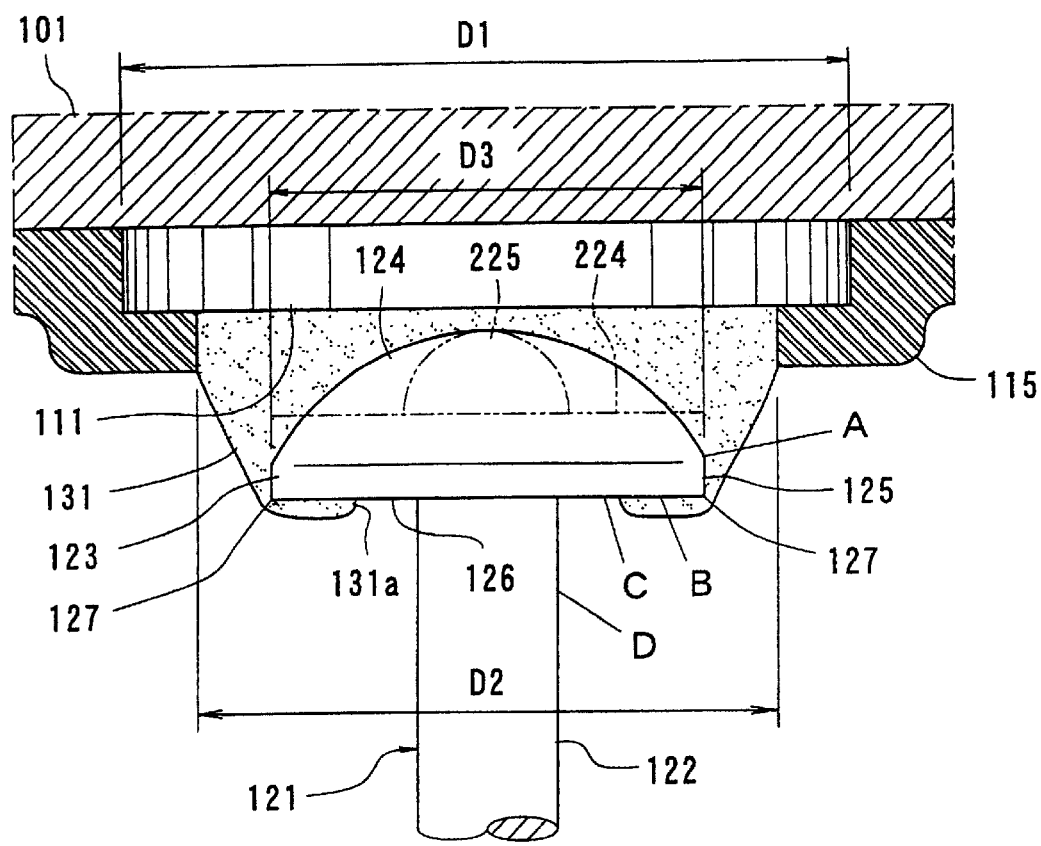
FIG. 2 is an enlarged view of the enlarged sectional view of FIG. 1.
Figure 3:
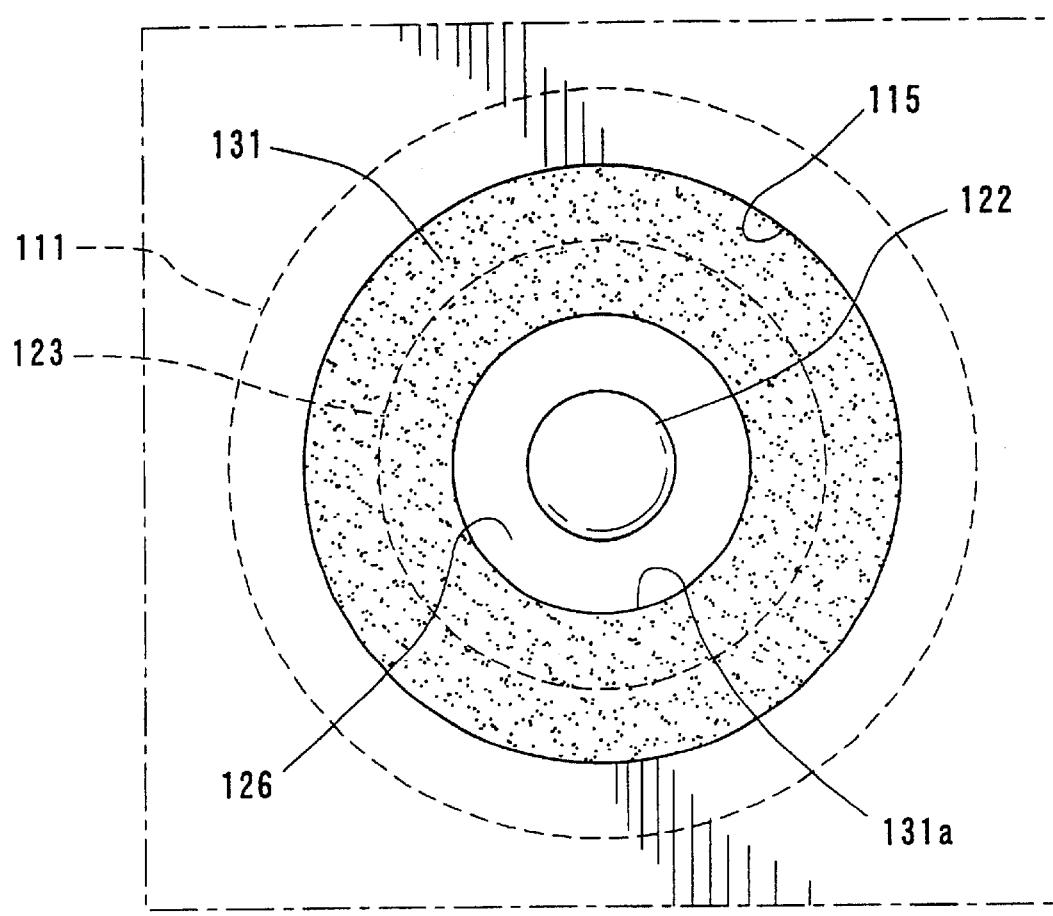
FIG. 3 is a plan view of FIG. 2 (as viewed from the tip end of the pin).
Figure 4:
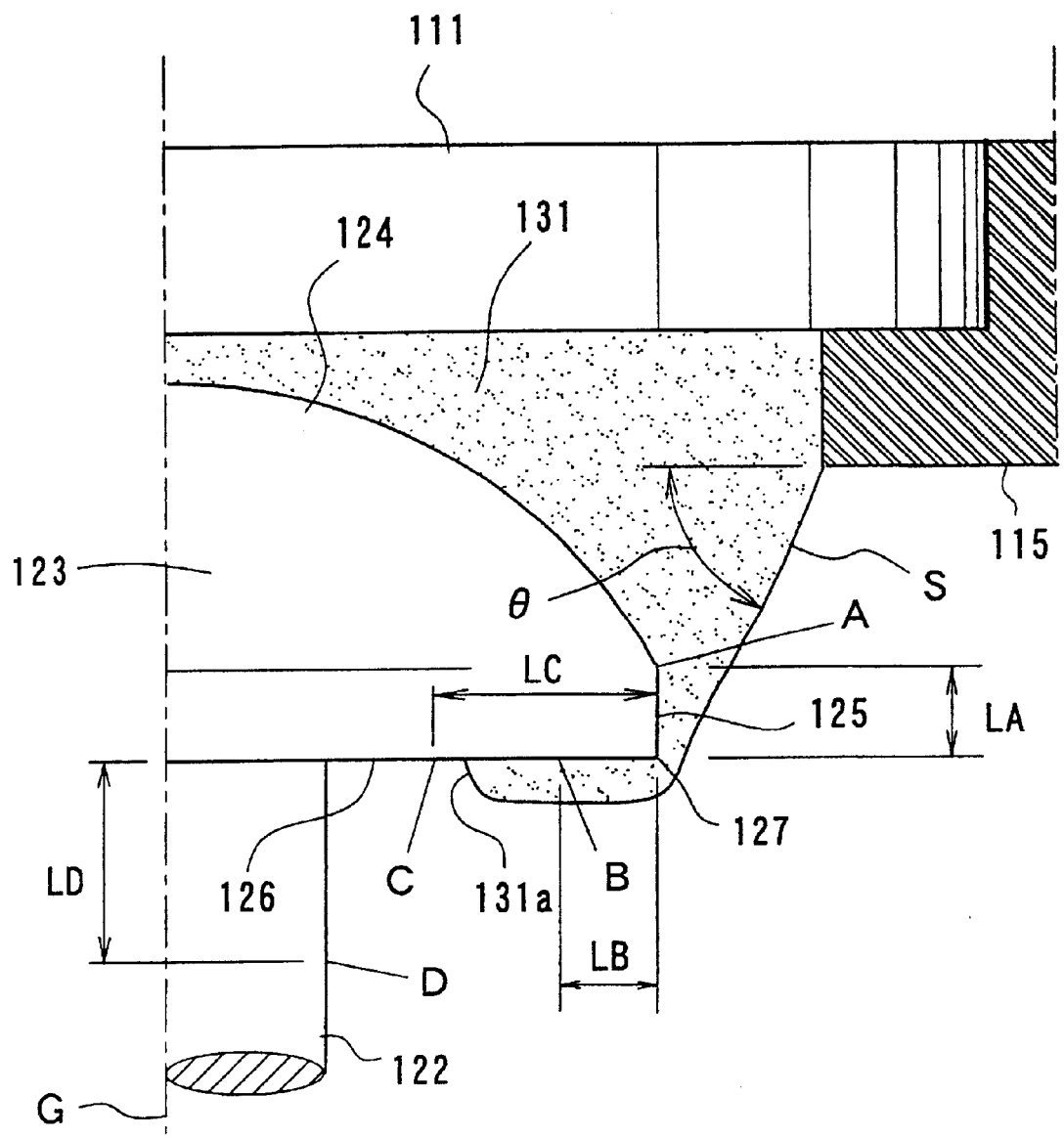
FIG. 4 is an enlarged view of FIG. 2.

A first embodiment of the present invention will next be described with reference to FIGS. 1 to 4. FIG. 1 is a side view showing a printed-wiring substrate having lead pins 100 and an enlarged sectional view showing a main portion thereof (pin-bonding structure). FIG. 2 is a further enlarged view of the enlarged sectional view of FIG. 1. FIG. 3 is a plan view of FIG. 2 (as viewed from the end of a pin). FIG. 4 is an enlarged view of FIG. 2. The printed-wiring substrate having lead pins 100 includes an epoxy resin substrate 101 of laminar structure serving as a main body thereof and assuming a rectangular shape as viewed from above. A number of electrodes (not shown) are formed on an upper main surface 103 for connection with a semiconductor integrated circuit device IC to be mounted on the substrate 101. Further, although not shown, internal wiring layers and vias for establishing connection among layers are formed within the substrate 101. A number of conductive layers (copper), each of which assumes, for example, a circular shape as viewed from below and is connected to the corresponding via, are formed on a lower main surface 104. Pin-bonding portions 111 are formed on the corresponding conductive layers by means of nickel plating and gold plating.

The substantially entire upper and lower main surfaces 103 and 104 of the substrate 101 are each covered with a solder resist layer 115 of epoxy resin having a predetermined thickness. In the present embodiment, the solder resist layer 115 is formed so as to cover a peripheral region of a predetermined width of each of the pin-bonding portions 111 so as to form an opening therein, thereby exposing a central region of the pin-bonding portion 111 in a concentric condition. Notably, in the present embodiment, diameter D1 of the pin-bonding portion (conductive layer) 111 is 1.05 mm, and diameter D2 of the exposed region of the pin-bonding portion 111 (of an opening formed in the solder resist layer 115); i.e., the diameter of a brazing surface, is 0.9 mm.

A pin 121 bonded in the present embodiment is made of an iron-nickel alloy, such as Kovar or 42 Alloy, or a copper alloy and has the form of a nail. The pin 121 includes a shaft portion (diameter: 0.3 mm) 122 having a circular cross section and the form of a circular rod, and a circular flange 123 projecting radially and concentrically at an upper end of the shaft portion 122. The flange 123 is plated with nickel and gold. A bonding surface 124 of the flange 123, which faces the pin-bonding portion 111, is entirely formed into a hemispherical, convex shape and is disposed so as to concentrically abut the pin-bonding portion 111. The thus-arranged flange 123 and the pin-bonding portion 111 are soldered by means of an appropriate amount of solder 131. Notably, the composition of the solder 131 (for example, Sn:95%, Sb:5%) is such that it has a melting point that is higher than the soldering temperature for the semiconductor integrated circuit device IC.

In the present embodiment, diameter D3 of the flange 123 of the pin 121 is 0.7 mm, which is smaller than the diameter D2 of an opening formed in the solder resist layer 115. The bonding surface 124, which abuts the pin-bonding portion 111, assumes a radius of sphere of about 0.35 mm. The total thickness of the flange 123 is 0.3 mm. The thickness of a gold plating layer formed on the surface of the pin 121 is rendered not less than 0.04 $\mu$m (0.05 $\mu$m in the present embodiment) to thereby improve oxidation resistance and reliability of connection to a socket. The pin 121 is produced by executing the following processes: forming into the above-mentioned shape by a known press working process; smoothing the surface by barrel polishing and chemical etching; and heating at a temperature not lower than 600° C. By heating the pin at a high temperature not lower than 600° C. (in the present embodiment, heating at a temperature of 780° C. to 850° C.), residual stress which has been generated in the pin during press working is released, thereby softening the pin. When stress is imposed on pin 121, the pin 121 itself is deformed to thereby absorb the stress. This lessens the stress that is imposed on a bonded portion between the pin 121 and the pin-bonding portion 111, and thus reduces the susceptibility of the bonded portion to breakage. Thus, although the creep height of a brazing filler metal is low as in the case of the present invention, a pin-bonding defect, such as separation of a pin from a pin-bonding portion, can be prevented.

In the thus-configured present embodiment, as shown in FIG. 2, the solder 131 used for soldering of the pin 121 extends by wetting to an opposite surface 126 of the flange 123, which is opposite the bonding surface 124 of the flange 123, via a side surface 125 of the flange 123. However, an extension-by-wetting end 131$a$ does not reach the root of the shaft portion 122. When the pin 121 is viewed from a tip end thereof in the direction of axis G, the extension-by-wetting end 131$a$ assumes the form of a concentric circle on the opposite surface 126 (see FIG. 3). As shown in FIG. 4, the contour S of a section of the brazing filler metal 131 as sectioned by a plane including the axis G of the shaft portion 122 is substantially linear, and $\theta$=71 degrees, where $\theta$ is an angle between the contour S and the main surface 104 of the printed-wiring substrate 101.

Since the solder 131 used for bonding of the pin 121 does not adhere to the shaft portion 122 of the pin 121, no problem arises when a semiconductor device, formed by mounting an IC on the substrate 101 and subsequent sealing, is mounted on a motherboard by inserting the pins 121 into a socket of the motherboard. Also, since the solder 131 extends beyond an outermost edge 127 of the opposite surface 126, or a ridgeline defined by the side surface 125 and the opposite surface 126, such that the extension-by-wetting end 131$a$ is located on the opposite surface 126, the amount of the solder 131 is sufficient for attaining sufficient bonding strength.

Figure 6:
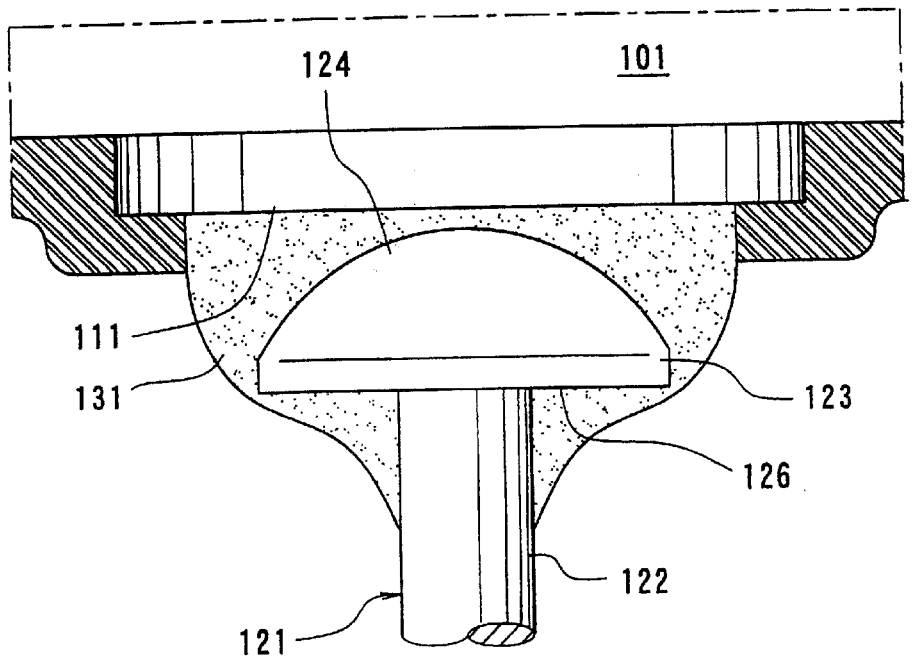
FIG. 6 is an enlarged sectional view showing the pin-bonding structure of a conventional printed-wiring substrate having lead pins.
Figure 7:
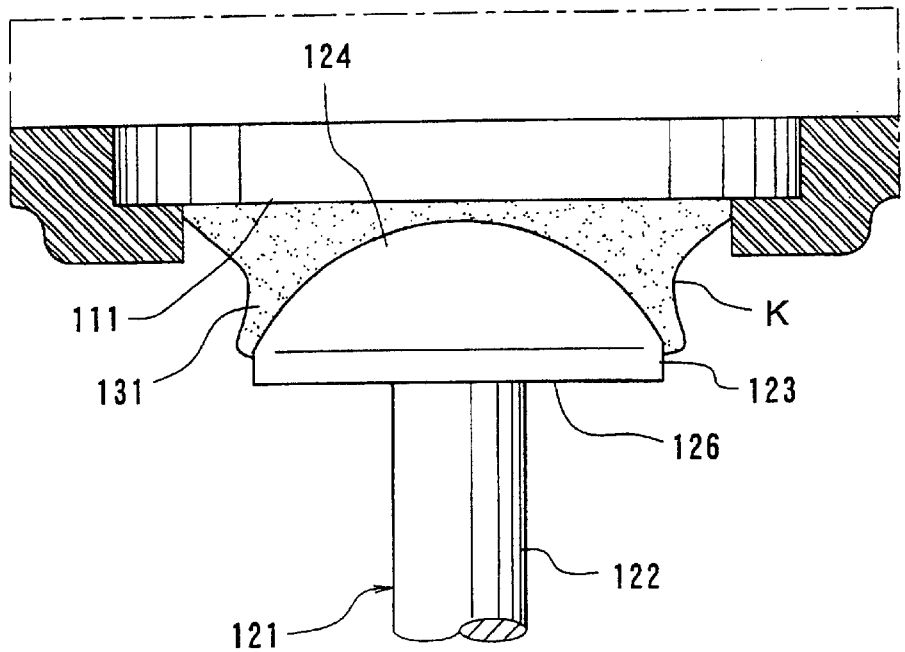
FIG. 7 is an enlarged sectional view showing the pin-bonding structure of a conventional printed-wiring substrate having lead pins.

Sample substrates (Nos. 1 to 4), each of which had 10 pins 121 brazed thereto, were prepared, while the amount of solder was varied such that the extension-by-wetting end 131$a$ of the solder 131 used for bonding of the pin 121 was located at point A, B, C, or D in FIGS. 2 and 4. The number of pins involving a narrow portion, in the form of a meniscus, of the brazing filler metal were counted, and the pins were checked for bonding strength. Point A (Sample No. 1) indicative of the position of the extension-by-wetting end 131$a$ is located LA (0.1–0.2 mm) below toward the bonding surface 124 from the outermost edge 127 of the opposite surface 126. Sample No. 1 represents a Comparative Example in which the extension-by-wetting end does not reach the opposite surface 126 as shown in FIG. 7. Point D (Sample No. 4) indicative of the position of the extension-by-wetting end 131$a$ is located LD (0.1–0.3 mm) toward the tip end of the shaft portion 122 from the root of the shaft portion 122 as shown in FIG. 6. Sample No. 4 represents a Comparative Example in which the solder 131 extends beyond the root of the shaft portion 122 toward the tip end of the shaft portion 122.

Point B (Sample No. 2) indicative of the position of the extension-BY-wetting end 131$a$ is located LB (0–0.1 mm) toward the shaft portion 122 from the outermost edge 127 of the opposite surface 126. Point C (Sample No. 3) is located LC (0.1–0.15 mm) toward the shaft portion 122 from the outermost edge 127 of the opposite surface 126. The bonding strength is a breaking load of the solder or a breaking load of a portion in the vicinity of a solder-bonding portion as measured when a pin is pulled in the axial direction or in a direction inclined by 30 degrees with respect to the axial direction. The results are shown in Table 1. The bonding strength is an average of measured values obtained by measuring 5 pins for bonding strength in one tensile direction and the other 5 pins in the other tensile direction for each of the samples.

TABLE 1

| Sample No. | Number of produced narrow portions | Bonding strength (kg) | |
| --- | --- | --- | --- |
| | | Pulled in axial direction | Pulled in inclined direction |
| 1* | 2 | 1.60 | 1.50 |
| 2 | 0 | 2.80 | 2.60 |
| 3 | 0 | 2.80 | 2.70 |
| 4* | 0 | 2.70 | 2.60 |

*Comparative Example

As shown in Table 1, two narrow portions of solder formed in Sample No. 1, whereas no narrow portions of solder formed in Sample Nos. 2 to 4. In Sample Nos. 2 and 3, the contour S of the solder was substantially linear as shown in FIG. 4 with respect to all of the pins. In Sample No. 4, the contour S of the solder was swollen into a convex arcuate shape as shown in FIG. 6. The test results reveal that in order to prevent occurrence of a narrow portion of solder, the amount of solder may be determined such that the solder extends by wetting to the opposite surface 126 as in the case of the present invention. Sample Nos. 2 to 4, which were free of a narrow solder portion, exhibited a bonding strength (kg) approximately 1.5–1.8 times that of Sample No. 1 (a Comparative Example), which had a narrow solder portion. The test results reveal that the presence of a narrow portion of solder impairs the bonding 15 strength. Sample Nos. 2 and 3, which fall within the scope of the present invention, exhibited a bonding strength substantially similar to that of Sample No. 4.

A bonding method for the above-mentioned pin 121 will next be described in detail. The bonding method is similar to that for a conventional printed-wiring substrate except that a solder paste is printed on, for example, the pin-bonding portion 111 in an amount such that the extension-by-wetting end 131a of solder is present on the opposite surface 126 of the flange 123; i.e., except that the amount of solder is adjusted. Preferably, the amount of solder is such that the extension-by-wetting end 131a of solder is located on the opposite surface 126 of the flange at a radially intermediate position. The amount of solder is determined by soldering while the solder amount is adjusted according to the diameter of the pin-bonding portion (the diameter of a brazing surface of the pin-bonding portion exposed through an opening formed in solder resist when solder resist is applied to the pin-bonding portion), the diameter and thickness of the flange, and the shape and dimension of a convex portion formed on the bonding surface of the flange such that the extension-by-wetting end is located at a desired position.

The substrate 101 in a state before bonding of pins thereto is formed by means of, for example, a subtractive process using copper plating. Subsequently, for example, a photosensitive solder resist layer is formed on the substrate 101 by a photolithography technique. The substrate 101 is exposed with a mask pattern such that an opening is formed at the center of each of the pin-bonding portions 111, followed by developing and curing to thereby form the solder resist layer 115. Subsequently, exposed metallic portions, such as pin-bonding portions, are plated with nickel and gold. Then, the aforementioned amount of solder paste is printed on the pin-bonding portions 111 by screen printing.

A predetermined plate jig (not shown) is prepared having a number of small holes formed therein, which are arranged according to the arrangement of the pin-bonding portions 111 formed on the substrate 101 and allows the corresponding pins 121 to be inserted thereinto. The pins 121 plated with nickel and gold are inserted into the corresponding holes formed in the plate jig while the flanges 123 rest on the plate jig. Next, the positioned substrate 101 is placed on the plate jig such that the pin-bonding portions 111 abut the corresponding bonding surfaces 124 of the flanges of the pins 121. Then, the solder paste is melted by applying heat. Thus, a number of pins 121 are soldered to the corresponding pin-bonding portions 111 simultaneously. At this time, excess molten solder of each of the pins 121 extends by wetting toward the opposite surface 126 of the flange 123 via the side surface 125 of the same. The range of extension of molten solder by wetting is as mentioned previously, thereby completing the printed-wiring substrate of the present invention.

Notably, the hemispherical portion, which serves as the convex portion, of the bonding surface 124 of the flange 123 of the pin 121 is not necessarily formed from the same material as that of a pin body. For example, a brazing filler metal having a melting point higher than the brazing (soldering) temperature of the pin is formed (deposited) into a hemispherical shape by reflowing. Such a pin has conventionally been used with a PGA type ceramic printed-wiring substrate, and can be easily manufactured from a nail-shaped pin having a flat-end flange (a flat head portion). Notably, the flange 123 of the pin 121 of the present embodiment is formed in the following manner. One end portion of a pin material (wire) is pressed in the axial direction against a die having a hemispherical concave, which corresponds to the hemispherical shape of the concave portion, formed therein.

A brazing filler metal (solder) used for brazing the pin may be selected from among those which do not melt at a soldering temperature for an electronic component, such as an IC, depending on the material of a printed-wiring substrate. Examples of such a brazing filler metal (solder) for use with a printed-wiring substrate formed from resin include Pb—Sn solders (37Pb—73Sn eutectic solder, 50Pb—50Sn solder, 82Pb—10Sn—8Sb solder, among others), Sn—Ag solders (96.5Sn—3.5Ag solder, among others), and Sn—Sb solders (95Sn—5Sb solder). However, in the case where the pin surface is plated with Au, as the wettability of a brazing filler metal (solder) improves with respect to the Au plating layer on the pin surface, the creep height of the brazing filler metal for brazing of the pin tends to increase. Accordingly, in terms of control of the creep height of a brazing filler metal, a brazing filler metal having a relatively low wettability with respect to an Au plating layer is preferred. Specifically, Sn—Sb and Pb—Sn—Sb types are preferred. Sn—Sb and Pb—Sn—Sb types having an Sb content of 3 wt % to 15 wt % are particularly preferred. Examples of such a preferred brazing filler metal include 95Sn—5Sb and 82Pb—10Sn—8Sb. By employing an Sb content of not less than 3 wt %, a reduction in wettability of the brazing filler metal is apparent, thereby facilitating control of the creep height of a brazing filler metal. In order to prevent an excessive reduction in wettability of the brazing filler metal, the Sb content is preferably not greater than 15 wt %. When the thickness of the Au plating layer on the pin surface is not less than 0.04 μm, the creep height of a brazing filler metal tends to increase. Thus, control of the creep height of a brazing filler metal by selecting the composition of a brazing filler metal becomes particularly important. Examples of a brazing filler metal for use with a printed-wiring substrate formed from ceramic include silver brazing filler metals, such as Ag—Cu, gold brazing filler metals, such as Au—Si, Au—Sn, and Au—Ge, and high-temperature solders, such as 95Pb—5Sn and 90Pb—10Sn.

The planar shape of the pin-bonding portion and the shape of the flange as viewed in the axial direction are usually circular as in the case of the present embodiment, but are not limited thereto. The bonding surface of the flange is not required to be entirely formed into a hemispherical shape as in the case of the present embodiment. As represented by the two-dots-and-dash line in FIG. 2, a portion of a flat bonding surface 224 may be formed into a hemispherical surface 225, which serves as the convex portion. As mentioned previously, the shape of the convex portion is not limited to a hemispherical shape, but may assume the form of a convex polyhedron or the form of a tapering-off cone or a cylinder, so long as a sufficient amount of solder can be accommodated in a space defined by the pin-bonding portion and the flange. The bonding surface of the flange, which serves as a soldering surface, is preferably roughened in order to increase the bonding area.

Figure 5:
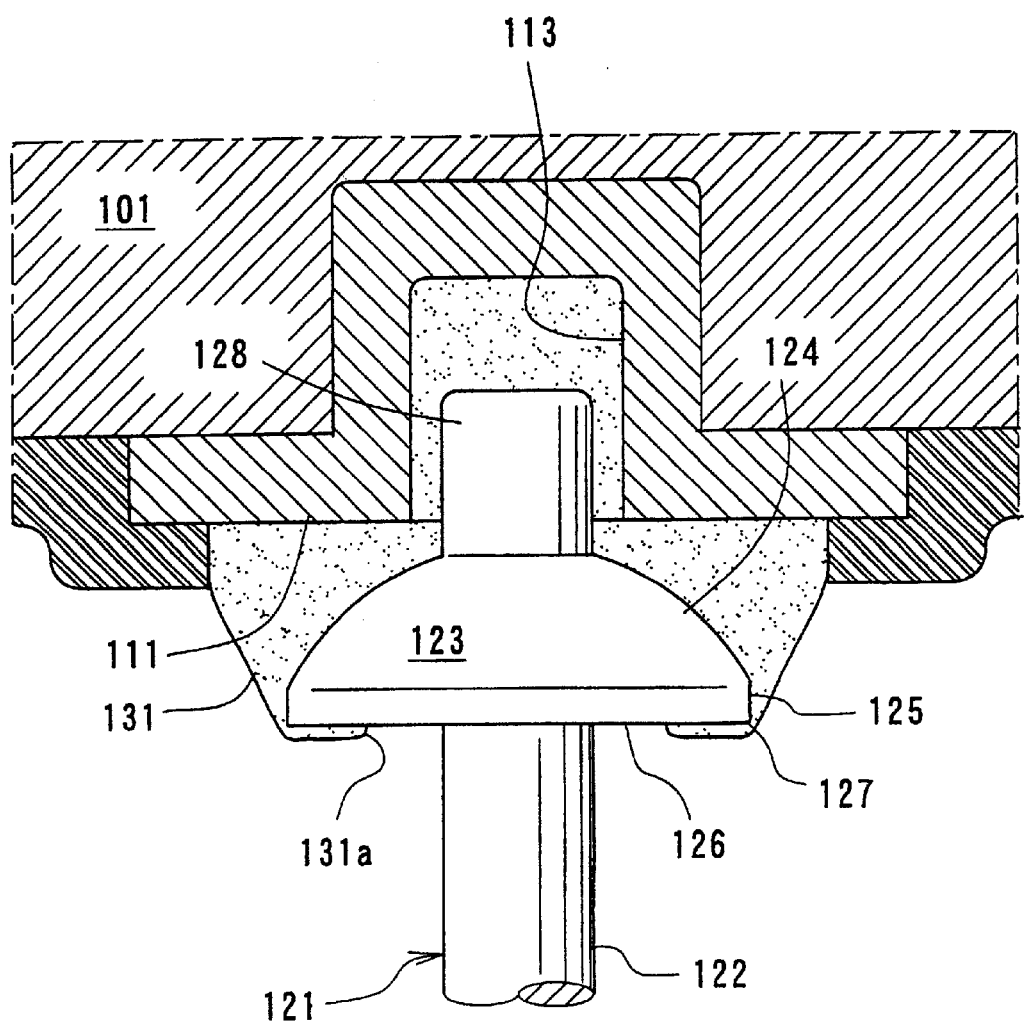
FIG. 5 is an enlarged sectional view of a main portion of a printed-wiring substrate having lead pins according to another embodiment of the present invention.

Another embodiment of the present invention will next be described with reference to FIG. 5. The present embodiment is essentially similar to the above-described embodiment except that the flange 123 of the pin 121 for brazing use is not located at an end of the shaft portion 122. Thus, only different features will be described while similar features are denoted by common reference numerals. The above embodiment is described while mentioning the nail-shaped pin which is soldered by soldering the flange located at an end thereof In the present embodiment, a pin-bonding portion (conductive layer) 111 of a substrate is not flat, and a hole 113 is formed at the center of the pin-bonding portion 111. The flange 123 of the pin 121 is located at an intermediate position of the shaft portion 122. The bonding surface 124 of the flange 123 assumes a convex (hemispherical) shape.

The pin 121 is soldered while an end portion 128 of the shaft portion 122 projecting from the bonding surface 124 of the flange 123 of the pin 121 is inserted into the hole 113 and while the bonding surface 124 is in contact with the pin-bonding portion 111. The brazing filler metal 131 used for brazing of the pin 121 extends by wetting toward the tip end of the pin 121 beyond the outermost edge 127 of the opposite surface 126 of the flange 123, which is opposite the bonding surface 124 of the flange 123, such that the extension-by-wetting end 131a is located between the outermost edge 127 and the shaft portion 122. Thus, the present embodiment produces an effect similar to that produced by the previously described embodiment.

The above embodiments are described while mentioning the printed-wiring substrate having lead pins which is embodied in the form of a PGA type printed-wiring substrate formed from epoxy resin. However, needless to say, the substrate of the present invention can be embodied regardless of the substrate material; i.e., regardless of whether the substrate is formed from, for example, polyimide resin, BT resin, or PPE resin. The present invention is not limited to a printed-wiring substrate formed from resin, but is applicable to a printed-wiring substrate formed from ceramic or glass ceramic as well as to a printed-wiring substrate formed from a composite material, such as glass-resin (epoxy resin or BT resin) which is produced by impregnating an organic fiber with the above-mentioned resin. The present invention is applicable to a printed-wiring substrate having lead pins regardless of substrate material as well as regardless of whether the substrate assumes a single-layer structure or a multilayer structure. The present invention is not limited to a PGA type printed-wiring substrate, but can be embodied in the form of any printed-wiring substrate in which lead pins are brazed to corresponding pin-bonding portions. The present invention is not limited to the above-described embodiments, but can be embodied while design is modified appropriately without departing from the spirit or scope of the invention.

As mentioned above, the printed-wiring substrate of the present invention can be embodied by means of a substrate of any material, such as ceramic or resin. Particularly, the present invention is embodied very effectively when applied to a resin substrate, for the following reason. Use of solder of low melting point for brazing of pins is unavoidable for a printed-wiring substrate formed from resin. As a result, pin bonding strength in particular tends to be comprised. However, according to the present invention, even when such a solder is used, pin bonding strength is reliably improved.

As described above, according to the present invention, a brazing filler metal used for brazing of a lead pin extends by wetting toward the tip end of the lead pin beyond the outermost edge of an opposite surface of a flange, which is opposite a bonding surface of the flange, such that an extension-by-wetting end of the brazing filler metal is located between the outermost edge and a shaft portion of the lead pin. Thus, in a printed-wiring substrate having lead pins of the present invention, solder does not adhere to the shaft portion of a lead pin or impair bonding strength, and exhibits a highly reliable electrical connection. Furthermore, since the lead pins are usually plated with gold, visual inspection can determine whether or not the extension-by-wetting end of molten brazing filler metal is located at the above-mentioned desired position. Thus, the printed-wiring substrate of the present invention significantly facilitates inspection for assurance of quality, or quality control.

This application is based on Japanese Patent Application No. 2000-25821 filed Feb. 3, 2000, which is incorporated herein by reference in its entirety.

What is claimed is:

1. A printed-wiring substrate comprising a substrate having pin-bonding portions formed on a main surface thereof and lead pins, the lead pins each having a flange and a shaft portion and being brazed to corresponding pin-bonding portions via the corresponding flanges, the flange having a convex portion formed on a bonding surface thereof in opposition to the pin-bonding portion, said printed-wiring substrate characterized in that:

a brazing filler metal brazing the lead pins to the pin-bonding portions extends by wetting from the convex portion of the lead pin beyond an outermost edge of a surface of the flange opposite the bonding surface such that the end of an extension of the brazing filler metal formed by wetting is located between the outermost edge and the shaft portion.

2. The printed-wiring substrate having lead pins as claimed in claim 1, wherein the entire bonding surface of the flange has a hemispherical form serving as the convex portion.

3. The printed-wiring substrate having lead pins as claimed in claim 1, wherein a portion of the bonding surface of the flange forms the convex portion.

4. The printed-wiring substrate having lead pins as claimed in claim 3, wherein the convex portion is located at the center of a bonding-surface side of the flange.

5. The printed-wiring substrate having lead pins as claimed in claims 1, wherein the diameter of a brazing surface of the pin-bonding portion is greater than the diameter of the flange.

6. The printed-wiring substrate having lead pins as claimed in claim 1, wherein the contour of a section of the brazing filler metal as sectioned by a plane including the axis of the shaft portion of the lead pin is substantially linear, and an angle $\theta$ between the contour and the main surface of said printed-wiring substrate falls within the range of 55 to 80 degrees.

7. The printed-wiring substrate having lead pins as claimed in claim 1, wherein said printed-wiring substrate is formed from resin.

* * * * *